(12) United States Patent
Ban et al.

(10) Patent No.: US 11,469,261 B2
(45) Date of Patent: Oct. 11, 2022

(54) ARRAY SUBSTRATE, DISPLAY APPARATUS, AND METHOD OF FABRICATING ARRAY SUBSTRATE

(71) Applicant: BOE Technology Group Co., Ltd., Beijing (CN)

(72) Inventors: Shengguang Ban, Beijing (CN); Zhanfeng Cao, Beijing (CN); Ke Wang, Beijing (CN); Qingzhao Liu, Beijing (CN); Shuilang Dong, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 91 days.

(21) Appl. No.: 16/769,725

(22) PCT Filed: Aug. 20, 2019

(86) PCT No.: PCT/CN2019/101566
§ 371 (c)(1),
(2) Date: Jun. 4, 2020

(87) PCT Pub. No.: WO2021/031117
PCT Pub. Date: Feb. 25, 2021

(65) Prior Publication Data
US 2021/0408088 A1    Dec. 30, 2021

(51) Int. Cl.
*H01L 27/14*   (2006.01)
*H01L 27/144*  (2006.01)
(Continued)

(52) U.S. Cl.
CPC .... *H01L 27/1443* (2013.01); *G02F 1/136209* (2013.01); *H01L 27/3227* (2013.01); *H01L 27/3272* (2013.01); *G02F 1/13685* (2021.01)

(58) Field of Classification Search
CPC ..... H01L 25/048; H01L 25/167; H01L 27/15; H01L 27/288; H01L 27/32;
(Continued)

(56) References Cited

U.S. PATENT DOCUMENTS

2008/0073490 A1 * 3/2008 Koide .................. G01J 1/44
250/214 R
2015/0364527 A1   12/2015 Wang et al.
(Continued)

FOREIGN PATENT DOCUMENTS

CN    106373969 A  *  2/2017  ......... G02F 1/13338
CN    108376696 A      8/2018
(Continued)

OTHER PUBLICATIONS

International Search Report & Written Opinion dated May 18, 2020, regarding PCT/CN2019/101566.

*Primary Examiner* — Samuel Park
(74) *Attorney, Agent, or Firm* — Intellectual Valley Law, P.C.

(57) ABSTRACT

An array substrate is provided. The array substrate includes a display area having a first array of subpixels; and a partially transparent area having a second array of subpixels. The partially transparent area includes a plurality of light emitting regions spaced apart from each other by a substantially transparent non-light emitting region. The second array of subpixels is limited in the plurality of light emitting regions. The array substrate further includes a plurality of photosensors and a plurality of first thin film transistors in the substantially transparent non-light emitting region. A respective one of the plurality of photosensors includes a first polarity semiconductor layer, a second polarity semi-
(Continued)

conductor layer, and an intrinsic semiconductor layer connecting the first polarity semiconductor layer and the second polarity semiconductor layer.

19 Claims, 14 Drawing Sheets

(51) Int. Cl.
*G02F 1/1362* (2006.01)
*H01L 27/32* (2006.01)
*G02F 1/1368* (2006.01)

(58) Field of Classification Search
CPC ..... H01L 51/0032; H01L 51/05; H01L 51/00; H01L 27/01; H01L 23/5222; H01L 27/322; H01L 27/3227; H01L 27/3269; H01L 27/3272; H01L 27/1443; H01L 27/1214; H01L 27/3216; H01L 27/3234; H01L 27/1259; H01L 27/3244; H01L 2227/323; G01Q 60/14; G01R 31/2656; G01R 31/2851; G02F 1/1333; G02F 1/136209; G02F 1/13685; G02F 2201/52; G02F 1/13312; G02F 1/13338; G02F 1/13318; G02F 1/136; G02F 1/1368; G06K 9/0004; G06K 9/209; G09F 9/00; G06V 40/13
See application file for complete search history.

(56) References Cited

U.S. PATENT DOCUMENTS

| | | | |
|---|---|---|---|
| 2018/0060641 A1* | 3/2018 | Kim | G06V 40/13 |
| 2018/0364845 A1* | 12/2018 | Lee | G06F 3/0412 |
| 2019/0393286 A1 | 12/2019 | Ding et al. | |
| 2020/0251539 A1 | 8/2020 | Fu | |
| 2021/0012078 A1* | 1/2021 | Chang | G06F 3/04166 |
| 2021/0042493 A1* | 2/2021 | Lius | G09G 3/3208 |

FOREIGN PATENT DOCUMENTS

| | | | | | |
|---|---|---|---|---|---|
| CN | 109166887 A | | 1/2019 | | |
| CN | 109300951 A | | 2/2019 | | |
| CN | 109801950 A | | 5/2019 | | |
| CN | 110047845 A | | 7/2019 | | |
| CN | 110070801 A | | 7/2019 | | |
| CN | 110071161 A | | 7/2019 | | |
| CN | 112215215 A | * | 1/2021 | ........... | G06F 3/0412 |
| CN | 112349232 A | * | 2/2021 | ........... | G06K 9/0004 |

\* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2019/101566, filed Aug. 20, 2019, the contents of which are incorporated by reference in the entirety.

TECHNICAL FIELD

The present invention relates to display technology, more particularly, to an array substrate, a display apparatus, and a method of fabricating an array substrate.

BACKGROUND

In recent years, display apparatuses are made to integrate photosensors to realize various functions such as photo-sensing, biometric information detection, and human-machine interaction. For example, a smart phone typically includes a fingerprint sensor to detect and recognize a user's fingerprint.

SUMMARY

In one aspect, the present invention provides an array substrate, comprising a display area comprising a first array of subpixels; and a partially transparent area comprising a second array of subpixels; wherein the partially transparent area comprises a plurality of light emitting regions spaced apart from each other by a substantially transparent non-light emitting region; the second array of subpixels is limited in the plurality of light emitting regions; and the array substrate further comprises a plurality of photosensors and a plurality of first thin film transistors in the substantially transparent non-light emitting region; wherein a respective one of the plurality of photosensors comprises a first polarity semiconductor layer, a second polarity semiconductor layer, and an intrinsic semiconductor layer connecting the first polarity semiconductor layer and the second polarity semiconductor layer; and a respective one of the plurality of first thin film transistors comprises a first gate electrode, a first active layer, and a first source electrode and a first drain electrode respectively connected to the first active layer.

Optionally, the intrinsic semiconductor layer and the first active layer are in a same layer and comprise a same polysilicon material; the first polarity semiconductor layer is electrically connected to the first source electrode; and the second polarity semiconductor layer comprises a metal oxide conductive material doped with an N-type dopant.

Optionally, a respective one of the plurality of light emitting regions comprises multiple subpixels of the second array of subpixels; the respective one of the plurality of light emitting regions is substantially surrounded by one or more photosensors of the plurality of photosensors; and multiple photosensors of the plurality of photosensors in the substantially transparent non-light emitting region are electrically connected in parallel to a same one of the plurality of first thin film transistors.

Optionally, in the display area and the plurality of light emitting regions of the partially transparent area, the array substrate comprises a plurality of second thin film transistors for driving light emission in the display area and the plurality of light emitting regions; wherein the array substrate further comprises a passivation layer on a side of the plurality of photosensors, the plurality of first thin film transistors, and the plurality of second thin film transistors away from a base substrate; and one or more layers on a side of the passivation layer away from the base substrate, and limited in the display area and in the plurality of light emitting regions of the partially transparent area; wherein the one or more layers are absent in the substantially transparent non-light emitting region.

Optionally, the second polarity semiconductor layer is electrically connected to a bias electrode; and the bias electrode, the first source electrode, and the first drain electrode are in a same layer and comprise a same material.

Optionally, in the display area and the plurality of light emitting regions of the partially transparent area, the array substrate comprises a plurality of second thin film transistors for driving light emission in the display area and the plurality of light emitting regions; a respective one of the plurality of second thin film transistors comprises a second gate electrode, a second active layer, and a second source electrode and a second drain electrode respectively connected to the second active layer; the second active layer, the intrinsic semiconductor layer, and the first active layer are in the same layer and comprise the same polysilicon material.

Optionally, the second polarity semiconductor layer is electrically connected to a bias electrode; and the bias electrode, the first source electrode, the first drain electrode, the second source electrode, and the second drain electrode are in a same layer and comprise a same material.

Optionally, multiple photosensors of the plurality of photosensors in the substantially transparent non-light emitting region are electrically connected in parallel to a same bias electrode.

Optionally, the array substrate further comprises a first light shielding layer substantially surrounding a respective one of the plurality of light emitting regions, and configured to shield at least a portion of light emitted out of the respective one of the plurality of light emitting regions from being received by an adjacent photosensor in the substantially transparent non-light emitting region.

Optionally, the array substrate further comprises a second light shielding layer substantially surrounding a respective one of the plurality of photosensors, and configured to shield the respective one of the plurality of photosensors from light emitted out of an adjacent subpixel in the plurality of light emitting regions.

Optionally, the array substrate further comprises a buffer layer between the first active layer and a base substrate; wherein the first active layer and the first polarity semiconductor layer are in direct contact with the buffer layer.

Optionally, the first polarity semiconductor layer comprises amorphous silicon doped with a P-type dopant; and the second polarity semiconductor layer comprises indium tin oxide.

Optionally, the first array of subpixels has a number density of subpixels higher than a number density of subpixels of the second array of subpixels.

Optionally, the first array of subpixels comprises first subpixels of a first color, first subpixels of a second color, and first subpixels of a third color; the second array of subpixels comprises second subpixels of the first color, second subpixels of the second color, and second subpixels of the third color; a number density of the first subpixels of the first color is substantially the same as a number density of the second subpixels of the first color; a number density of the first subpixels of the second color is substantially the same as a number density of the second subpixels of the second color; and a number density of the first subpixels of the third color is approximately twice of a number density of the second subpixels of the third color.

In another aspect, the present invention provides a display apparatus, comprising the array substrate described herein or fabricated by a method described herein, and one or more integrated circuits connected to the array substrate.

Optionally, the display apparatus is a self-emitting display apparatus; a respective subpixel of the first array of subpixels comprises a self-emitting light emitting element; and a respective subpixel of the second array of subpixels comprises a self-emitting light emitting element.

Optionally, the display apparatus is a liquid crystal display apparatus comprising the array substrate; a counter substrate facing the array substrate; a liquid crystal layer between the array substrate and the counter substrate; and a back light on a side of the array substrate away from the counter substrate; wherein the liquid crystal layer is absent in the substantially transparent non-light emitting region.

In another aspect, the present invention provides a method of fabricating an array substrate, comprising forming a first array of subpixels in a display area; and forming a second array of subpixels in a partially transparent area; wherein the partially transparent area comprises a plurality of light emitting regions spaced apart from each other by a substantially transparent non-light emitting region; the second array of subpixels is limited in the plurality of light emitting regions; and the method further comprises forming a plurality of photosensors and forming a plurality of first thin film transistors in the substantially transparent non-light emitting region; wherein a respective one of the plurality of photosensors is formed to comprise a first polarity semiconductor layer, a second polarity semiconductor layer, and an intrinsic semiconductor layer connecting the first polarity semiconductor layer and the second polarity semiconductor layer; and a respective one of the plurality of first thin film transistors is formed to comprise a first gate electrode, a first active layer, and a first source electrode and a first drain electrode respectively connected to the first active layer.

Optionally, the intrinsic semiconductor layer and the first active layer are formed in a same layer using a same polysilicon material and a same mask plate; the first polarity semiconductor layer is electrically connected to the first source electrode; and the second polarity semiconductor layer is formed using a metal oxide conductive material doped with an N-type dopant.

Optionally, the method comprises forming a buffer layer on a base substrate; forming a first amorphous silicon material layer on a side of the buffer layer away from the base substrate; doping the first amorphous silicon material layer with a P-type dopant; patterning the first amorphous silicon material layer to form the first polarity semiconductor layer; forming a second amorphous silicon material layer on a side of the buffer layer and the first polarity semiconductor layer away from the base substrate; crystallizing the second amorphous silicon material layer to form a polysilicon material layer; and patterning the polysilicon material layer to form the intrinsic semiconductor layer and the first active layer; wherein the intrinsic semiconductor layer is formed on a side of the first polarity semiconductor layer away from the base substrate, and is in direct contact with the first polarity semiconductor layer.

Optionally, subsequent to forming the intrinsic semiconductor layer and the first active layer, the method further comprises forming a metal oxide conductive material layer on a side of the intrinsic semiconductor layer away from the base substrate; doping the metal oxide conductive material layer with the N-type dopant; and patterning the metal oxide conductive material layer to form the second polarity semiconductor layer.

Optionally, subsequent to forming the second polarity semiconductor layer, the method further comprises forming a conductive material layer on a side of the second polarity semiconductor layer away from the base substrate; patterning the conductive material layer to form a bias electrode, the first source electrode, and the first drain electrode; wherein the bias electrode is electrically connected to the second polarity semiconductor layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In related display apparatuses, a notch is typically formed by punching a hole through the display apparatus, in order to install accessories such as a camera lens and photosensors for detecting light. The presence of the notch results in waste of image display area. Driven by aesthetic considerations, full-screen display panels have been developed. However, it remains an issue how to dispose accessories such as camera and photosensors in a full-screen display panel.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a display area including a first array of subpixels; and a partially transparent area including a second array of subpixels. In some embodiments, the partially transparent area includes a plurality of light emitting regions spaced apart from each other by a substantially transparent non-light emitting region. Optionally, the second array of subpixels is limited in the plurality of light emitting regions. Optionally, the array substrate further includes a plurality of photosensors and a plurality of first thin film transistors in the substantially transparent non-light emitting region. Optionally, a respective one of the plurality of photosensors includes a first polarity semiconductor layer, a second polarity semiconductor layer, and an intrinsic semiconductor layer connecting the first polarity semiconductor layer and the second polarity semiconductor layer. Optionally, a respective one of the plurality of first thin film transistors includes a first gate electrode, a first active layer, and a first source electrode and a first drain electrode respectively connected to the first active layer. Optionally, the intrinsic semiconductor layer and the first active layer are in a same layer and includes a same polysilicon material. Optionally, the first polarity semiconductor layer is electrically connected to the first source electrode. Optionally, the second polarity semiconductor layer includes a metal oxide conductive material doped with an N-type dopant.

Figure 1A:
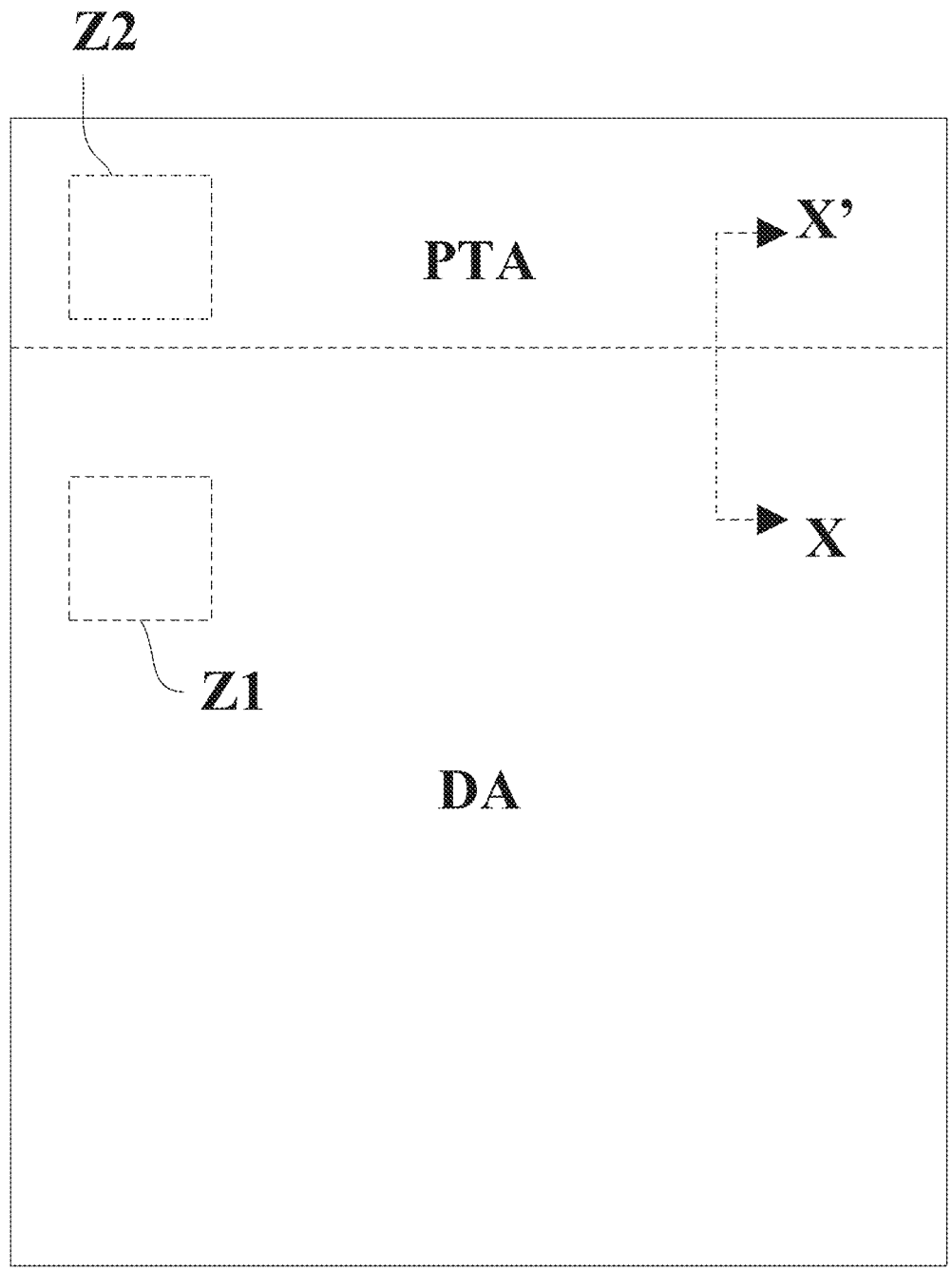
FIG. 1A is a plan view of an array substrate in some embodiments of the present disclosure.

FIG. 1A is a plan view of an array substrate in some embodiments of the present disclosure. Referring to FIG. 1A, the array substrate in some embodiments includes a display area DA and a partially transparent area PTA adjacent to the display area DA. As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. As used herein, the term "partially transparent area" refers to an area of the display substrate wherein a portion of which displays image, and a portion of which does not display image and allows installation of one or more components that are not light emitting. For example, the portion that does not display image may be configured to dispose photosensors, e.g., photosensors of a camera. Other non-light emitting components may be disposed in the portion of the partially transparent area that does not display image, examples include a camera lens, a fingerprint sensor, an earpiece, a camera, a distance sensor, an infrared sensor, an acoustic sensor, an indicator, a button, a knob, or any combination thereof. The partially transparent area allows a full-screen display without a hole or a punch-through window region in the array substrate. Optionally, the partially transparent area includes a plurality of image display portions spaced apart by the partially transparent area.

Figure 1B:
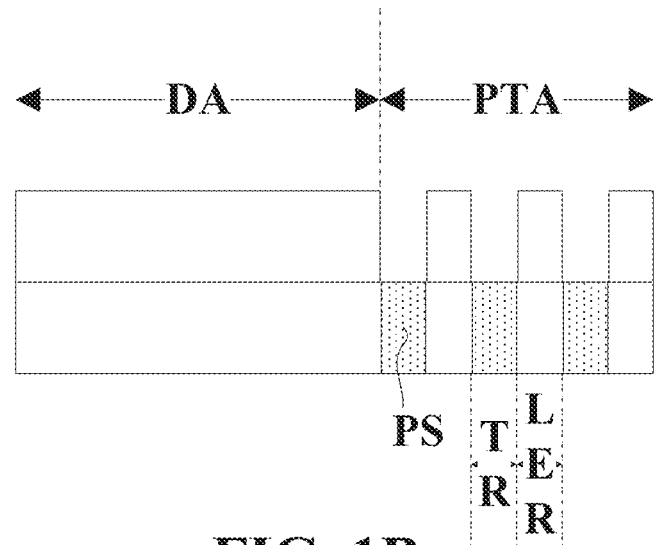
FIG. 1B is a cross-sectional view along an X-X' line in FIG. 1A.
Figure 1C:
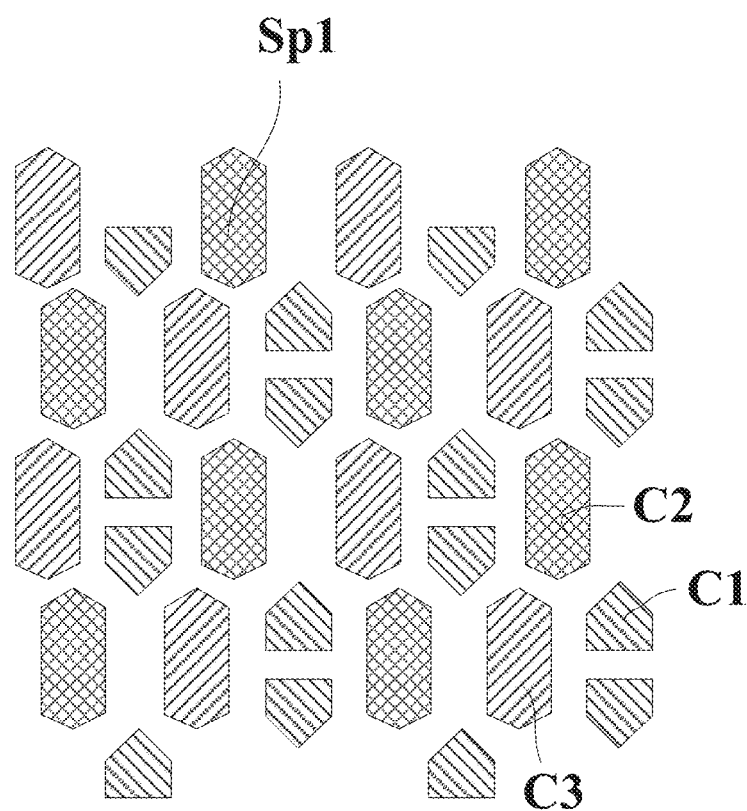
FIG. 1C is a zoom-in view of a Z1 region in FIG. 1A.
Figure 1D:
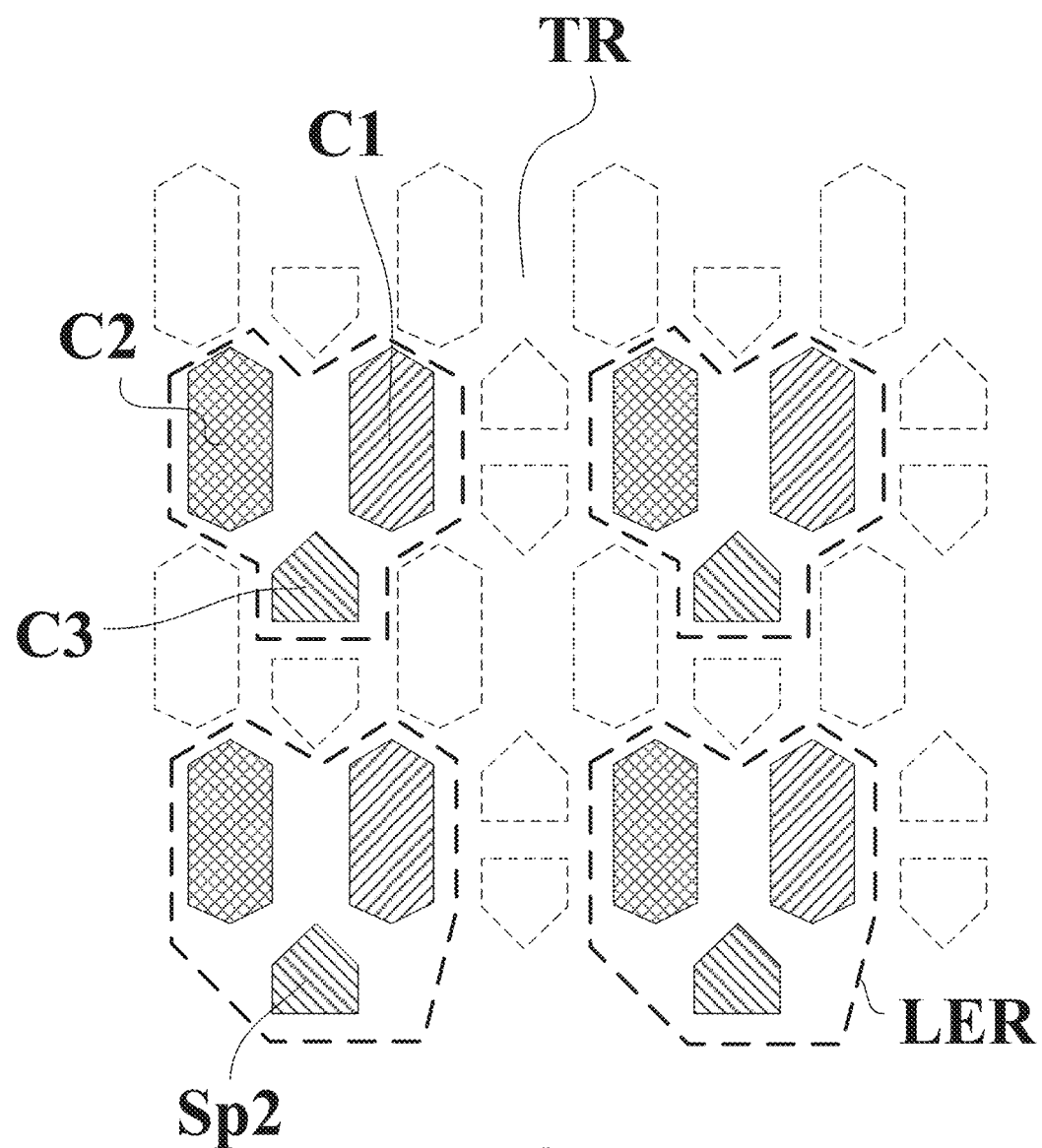
FIG. 1D is a zoom-in view of a Z2 region in FIG. 1A.

FIG. 1B is a cross-sectional view along an X-X' line in FIG. 1A. FIG. 1C is a zoom-in view of a Z1 region in FIG. 1A. FIG. 1D is a zoom-in view of a Z2 region in FIG. 1A. Referring to FIG. 1B, FIG. 1C, and FIG. 1D, the array substrate includes a display area DA including a first array of subpixels Sp1; and a partially transparent area PTA including a second array of subpixels Sp2. In some embodiments, the partially transparent area PTA includes a plurality of light emitting regions LER spaced apart from each other by a substantially transparent non-light emitting region TR. Optionally, the second array of subpixels Sp2 is limited in the plurality of light emitting regions LER. Optionally, the array substrate further includes a plurality of photosensors PS in the substantially transparent non-light emitting region TR.

In the display area DA, as shown in FIG. 1A and FIG. 1C, the plurality of photosensors PS are absent, and a normal display is performed in the display area DA. In one example, the first array of subpixels Sp1 includes a standard compact C1-C1-C2-C3 array, in which C1 stands for a subpixel of a first color (e.g., a red subpixel), C2 stands for a subpixel of a second color (e.g., a green subpixel), and C3 stands for a subpixel of a third color (e.g., a blue subpixel). In the partially transparent area PTA, as shown in FIG. 1A and FIG. 1D, only some subpixels perform normal display, and other "subpixels" are transformed into substantially transparent regions and are not light emitting, as indicated by "subpixels" of dotted lines in FIG. 1D. To ensure that the gate-on-array driving circuit and the chip driver can satisfactorily drive image display in both the display area DA and the partially transparent area PTA, the display resolution (e.g., pixel-per-inch) in the display area DA is set to be the display resolution in the partially transparent area PTA multiplying a multiplication factor. Optionally, the multiplication factor is an integer factor (e.g., 2). To ensure a satisfactory display result, optionally, the second array of subpixels Sp2 includes a C1-C2-C3 array, in which C1 stands for a subpixel of a first color (e.g., a red subpixel), C2 stands for a subpixel of a second color (e.g., a green subpixel), and C3 stands for a subpixel of a third color (e.g., a blue subpixel).

Figure 2:
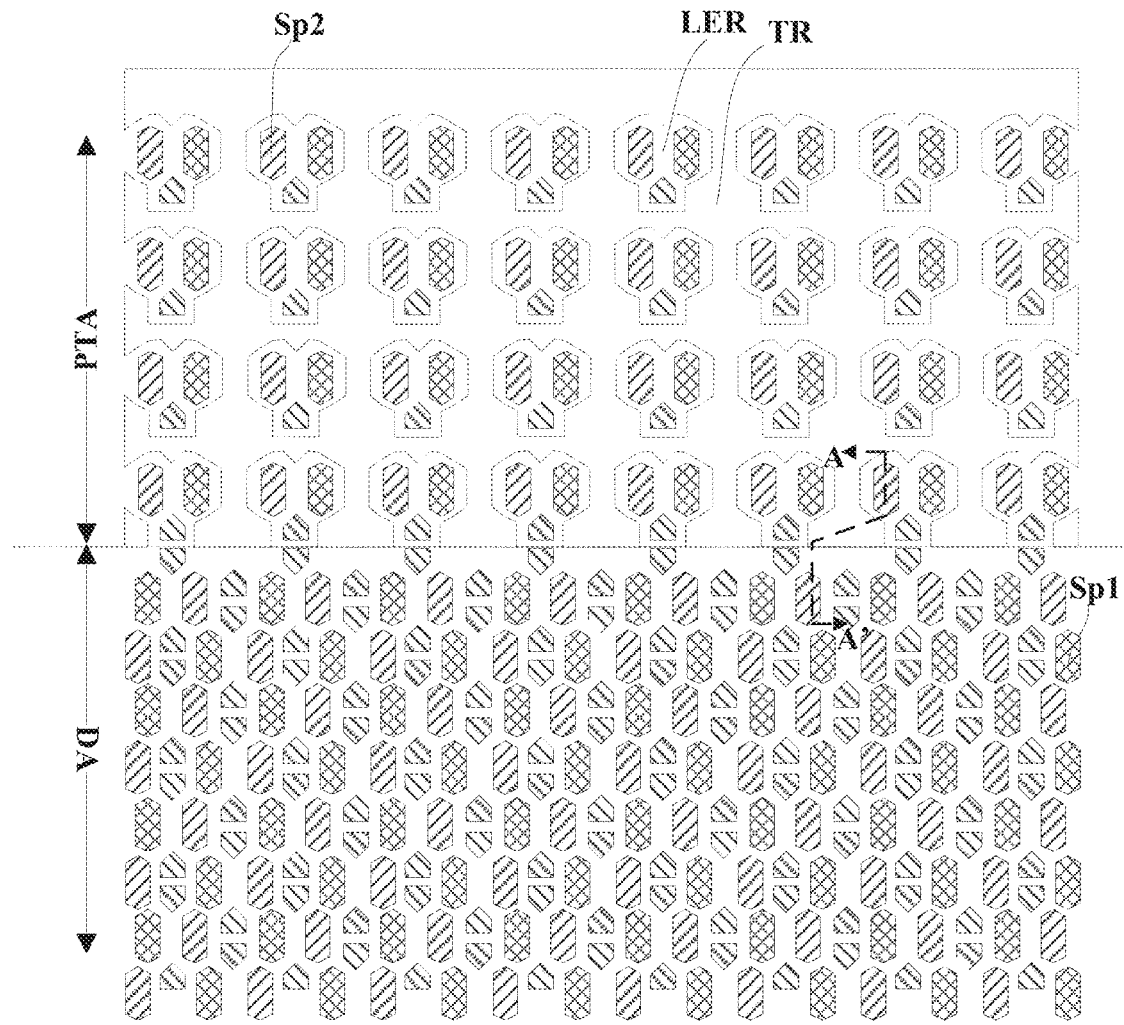
FIG. 2 is a schematic diagram illustrating the structure of an array substrate in some embodiments of the present disclosure.

FIG. 2 is a schematic diagram illustrating the structure of an array substrate in some embodiments of the present disclosure. Referring to FIG. 1A and FIG. 2, the array substrate includes a display area DA including a first array of subpixels Sp1; and a partially transparent area PTA including a second array of subpixels Sp2. In some embodiments, the partially transparent area PTA includes a plurality of light emitting regions LER spaced apart from each other by a substantially transparent non-light emitting region TR. Optionally, the second array of subpixels Sp2 is limited in the plurality of light emitting regions LER.

Figure 3:
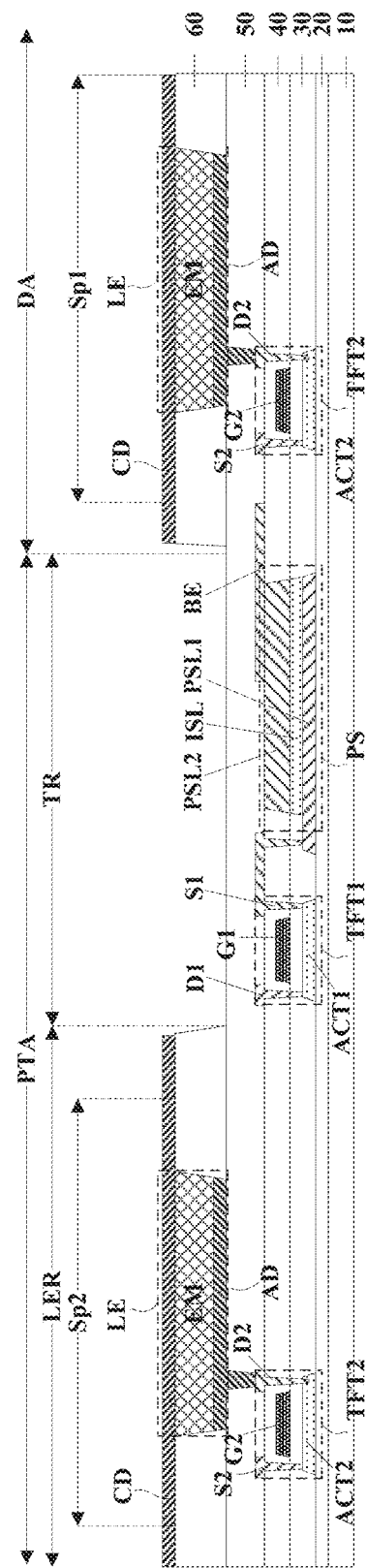
FIG. 3 is a cross-sectional view along an A-A' line of the array substrate of FIG. 2.

FIG. 3 is a cross-sectional view along an A-A' line of the array substrate of FIG. 2. Referring to FIGS. 1 to 3, the array substrate in some embodiments further includes a plurality of photosensors PS and a plurality of first thin film transistors TFT1 in the substantially transparent non-light emitting region TR. Optionally, a respective one of the plurality of photosensors PS includes a first polarity semiconductor layer PSL1, a second polarity semiconductor layer PSL2, and an intrinsic semiconductor layer ISL connecting the first polarity semiconductor layer PSL1 and the second polarity semiconductor layer PSL2.

Optionally, a respective one of the plurality of first thin film transistors TFT1 includes a first gate electrode G1, a first active layer ACT1, and a first source electrode S1 and a first drain electrode D1 respectively connected to the first active layer ACT1. Optionally, the first polarity semiconductor layer PSL1 is electrically connected to the first source electrode S1.

Optionally, the second polarity semiconductor layer PSL2 includes a metal oxide conductive material doped with an N-type dopant. Examples of N-type dopants include a Group VA element of the Periodic Table of the Elements including nitrogen (N), phosphorous (P), arsenic (As), antimony (Sb), and bismuth (Bi). In one example, the second polarity semiconductor layer PSL2 includes indium tin oxide doped with an N-type dopant.

Optionally, the first polarity semiconductor layer PSL1 includes a semiconductor material doped with a P-type dopant. Examples of P-type dopants include a Group IIIA element of the Periodic Table of the Elements including boron (B), aluminum (Al), gallium (Ga), indium (In), and thallium (Tl). In one example, the first polarity semiconductor layer PSL1 includes amorphous silicon doped with a P-type dopant.

Optionally, the intrinsic semiconductor layer ISL and the first active layer ACT1 are in a same layer and includes a same polysilicon material. As used herein, the term "same layer" refers to the relationship between the layers simultaneously formed in the same step. In one example, the intrinsic semiconductor layer ISL and the first active layer ACT1 are in a same layer when they are formed as a result of one or more steps of a same patterning process performed in a same layer of material. In another example, the intrinsic semiconductor layer ISL and the first active layer ACT1 can be formed in a same layer by simultaneously performing the step of forming the intrinsic semiconductor layer ISL and the step of forming the first active layer ACT1. The term "same layer" does not always mean that the thickness of the layer or the height of the layer in a cross-sectional view is the same.

In some embodiments, and referring to FIG. 3, in the display area DA and the plurality of light emitting regions LER of the partially transparent area PTA, the array substrate includes a plurality of second thin film transistors TFT2 for driving light emission in the display area DA and the plurality of light emitting regions LER. Optionally, a respective one of the plurality of second thin film transistors TFT2 includes a second gate electrode G2, a second active layer ACT2, and a second source electrode S2 and a second drain electrode D2 respectively connected to the second active layer ACT2.

In some embodiments, the array substrate is a self-emitting array substrate that does not require a back light for image display. Optionally, the array substrate in the display area DA and the plurality of light emitting regions LER of the partially transparent area PTA further includes a plurality of light emitting elements LE. Various appropriate light emitting elements may be used in the present display substrate. Examples of appropriate light emitting elements include organic light emitting diodes, quantum dots light emitting diodes, and micro light emitting diodes. Optionally, a respective subpixel in the first array of subpixels Sp1 includes one of the plurality of light emitting elements LE, and a respective subpixel in the second array of subpixels Sp2 includes one of the plurality of light emitting elements LE.

In some embodiments, a respective one of the plurality of light emitting elements LE includes an anode AD, a light emitting layer EM, and a cathode CD. The light emitting layer EM is between the anode AD and the cathode CD. The anode AD is electrically connected to the second drain electrode D2 of the respective one of the plurality of second thin film transistors TFT2.

Referring to FIG. 3, the array substrate includes a base substrate 10 and a buffer layer 20 on the base substrate 10. The first active layer ACT1, the second active layer ACT2, and the first polarity semiconductor layer PSL1 are on a side of the buffer layer 20 away from the base substrate 10. Optionally, the first active layer ACT1 and the first polarity semiconductor layer PSL1 are in direct contact with the buffer layer 20. Optionally, the intrinsic semiconductor layer ISL is on a side of the first polarity semiconductor layer PSL1 away from the buffer layer 20. The array substrate further includes a gate insulating layer 30 on a side of the first active layer ACT1 and the second active layer ACT2 away from the buffer layer 20. The first gate electrode G1 and the second gate electrode G2 are on a side of the gate insulating layer 30 away from the base substrate 10. The array substrate further includes an inter-layer dielectric layer 40 on a side of the first gate electrode G1 and the second gate electrode G2 away from the base substrate 10. The first source electrode S1, the second source electrode S2, the first drain electrode D1, and the second drain electrode D2 are on a side of the inter-layer dielectric layer 40 away from the base substrate 10. The array substrate further includes a passivation layer 50 on a side of the first source electrode S1, the second source electrode S2, the first drain electrode D1, and the second drain electrode D2 away from the base substrate 10. The anode AD is on a side of the passivation layer 50 away from the base substrate 10. The array substrate further includes a pixel definition layer 60 on a side of the passivation layer 50 away from the base substrate 10, defining a plurality of subpixel apertures. The light emitting layer EM is disposed in a respective one of the plurality of subpixel apertures, and the cathode CD is on a side of the light emitting layer EM away from the anode AD.

To facilitate light detection by the plurality of photosensors PS, in some embodiments, one or more of the pixel definition layer 60, the anode AD, the light emitting layer EM, and the cathode CD are substantially limited in the display area DA and in the plurality of light emitting regions LER of the partially transparent area PTA, and are absent in the substantially transparent non-light emitting region TR.

In some embodiments, and referring to FIG. 3, the array substrate further includes a bias electrode BE. The second polarity semiconductor layer PSL2 is electrically connected to a bias electrode BE. Optionally, the bias electrode BE, the first source electrode S1, and the first drain electrode D1 are in a same layer and include a same material.

In some embodiments, and referring to FIG. 3, the second active layer ACT2, the intrinsic semiconductor layer ISL, and the first active layer ACT1 are in the same layer and include the same polysilicon material.

In some embodiments, and referring to FIG. 3, the bias electrode BE, the first source electrode S1, the first drain electrode D1, the second source electrode S2, and the second drain electrode D2 are in a same layer and include a same material.

Figure 4:
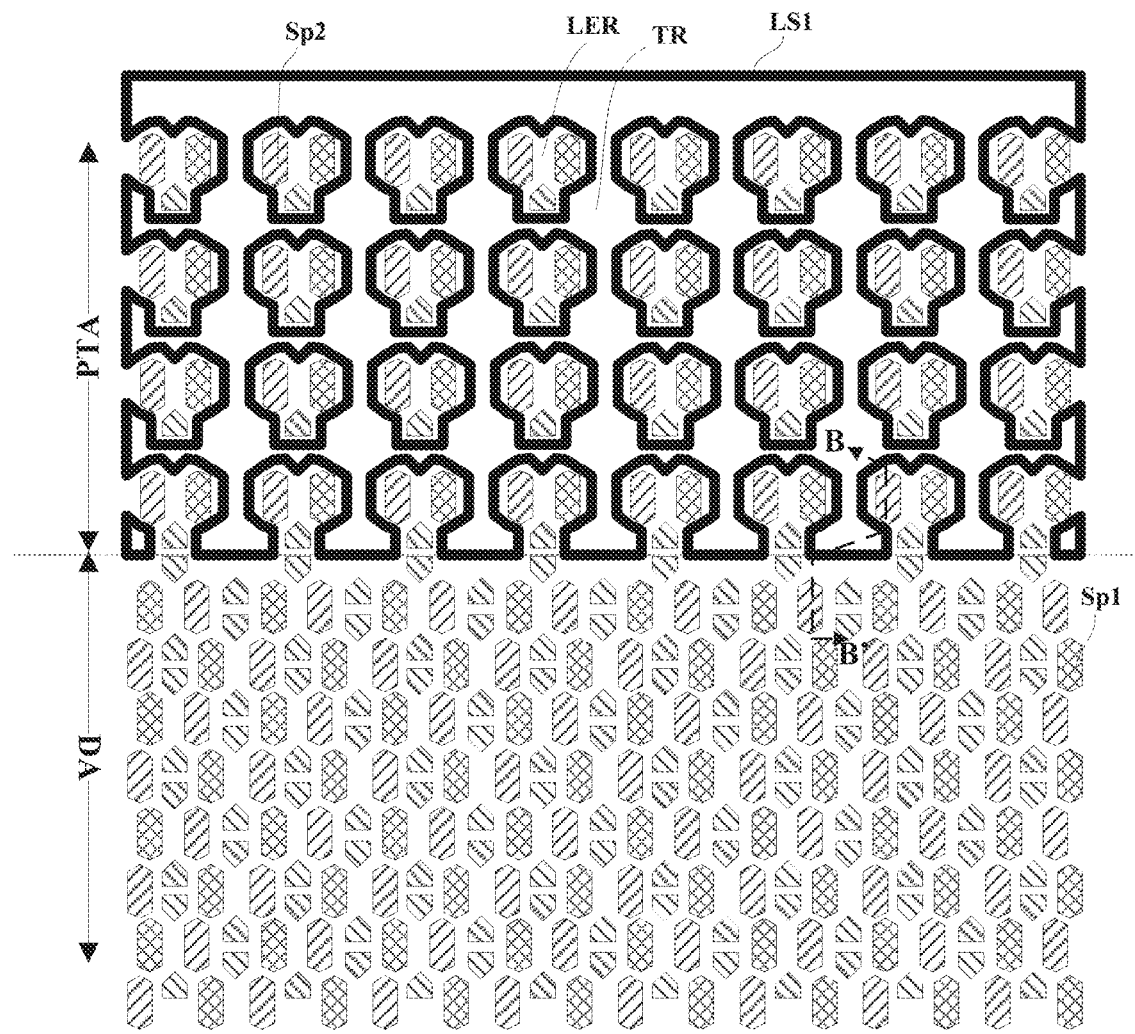
FIG. 4 is a schematic diagram illustrating the structure of an array substrate in some embodiments of the present disclosure.
Figure 5:
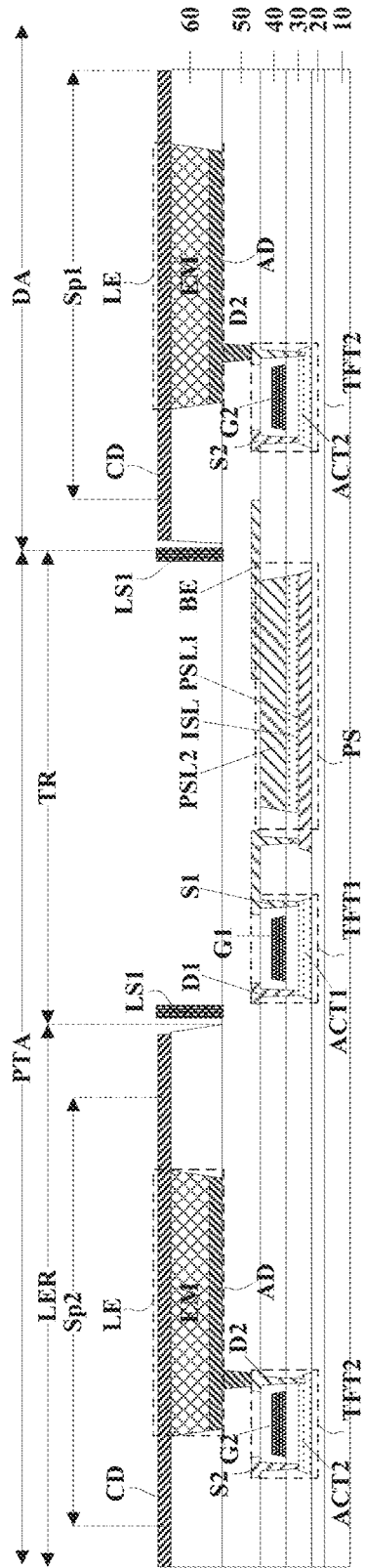
FIG. 5 is a cross-sectional view along a B-B' line of the array substrate of FIG. 4.

FIG. 4 is a schematic diagram illustrating the structure of an array substrate in some embodiments of the present disclosure. FIG. 5 is a cross-sectional view along a B-B' line of the array substrate of FIG. 4. Referring to FIG. 4 and FIG. 5, in some embodiments, the array substrate further includes a first light shielding layer LS1 substantially surrounding a respective one of the plurality of light emitting regions LER, and configured to shield at least a portion of light emitted out of the respective one of the plurality of light emitting regions LER from being received by an adjacent photosensor in the substantially transparent non-light emitting region TR. The first light shielding layer LS1 is disposed along all boundaries between the substantially transparent non-light emitting region TR and the display area DA. Moreover, the first light shielding layer LS1 is also disposed along all boundaries between the substantially transparent non-light emitting region TR and the plurality of light emitting regions LER.

In one example, as shown in FIG. 5, the first light shielding layer LS1 is on a side of the passivation layer 50 away from the base substrate 10. Optionally, the first light shielding layer LS1 has a height relative to a main surface of the passivation layer 50 equal to or greater than a height of the light emitting layer EM relative to the main surface of the passivation layer 50. Other appropriate designs may be implemented for disposing the first light shielding layer LS1. In another example, the first light shielding layer LS1 may be disposed on a surface of the inter-layer dielectric layer 40, and protruding along a direction away from the base substrate 10. In another example, the first light shielding layer LS1 may be disposed on a surface of the gate insulating layer 30, and protruding along a direction away from the base substrate 10.

Figure 6A:
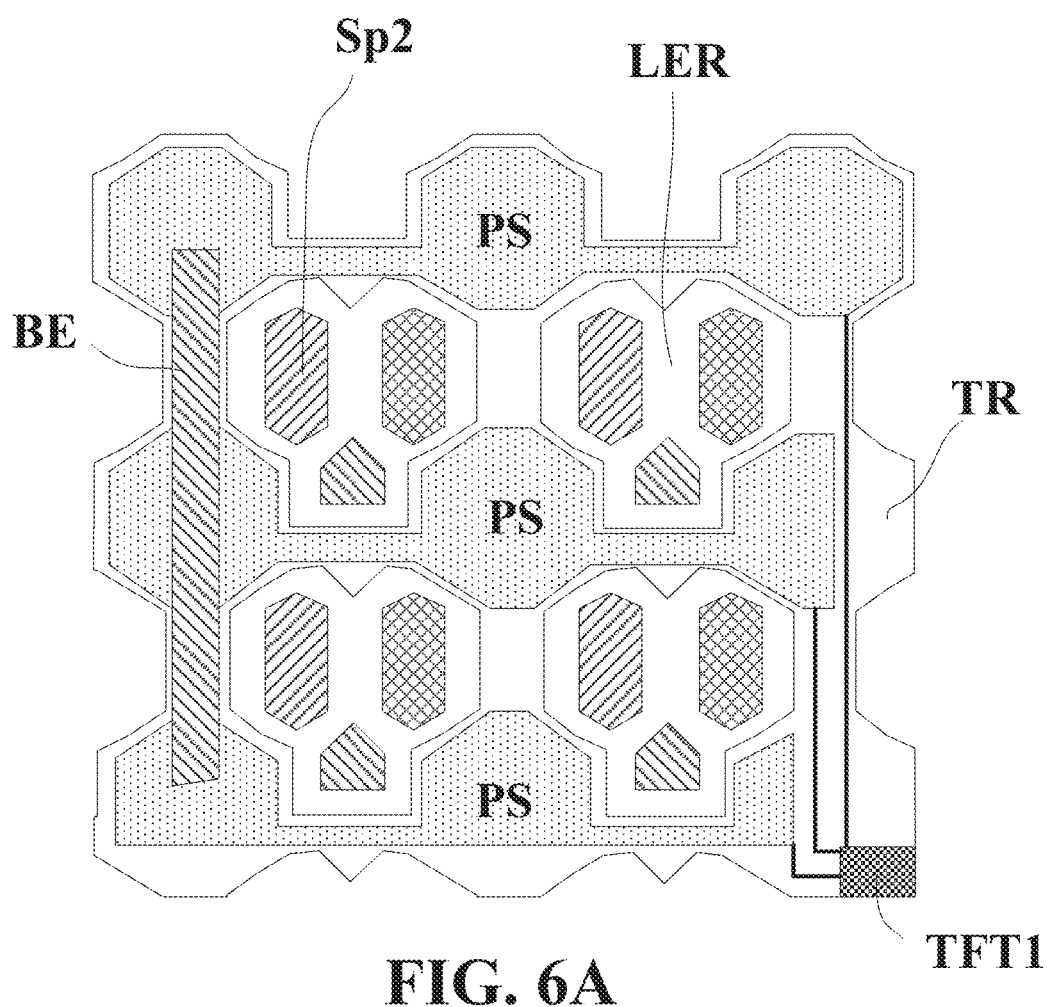
FIG. 6A illustrates the structure of a portion of an array substrate in a partially transparent area in some embodiments of the present disclosure.

FIG. 6A illustrates the structure of a portion of an array substrate in a partially transparent area in some embodiments of the present disclosure. Referring to FIG. 6A, a respective one of the plurality of light emitting regions LER includes multiple subpixels of the second array of subpixels Sp2, for example, includes a subpixel of a first color (e.g., a red subpixel), a subpixel of a second color (e.g., a green subpixel), and a subpixel of a third color (e.g., a blue subpixel). Optionally, the respective one of the plurality of light emitting regions LER is substantially surrounded by one or more photosensors of the plurality of photosensors PS. As used herein the term "substantially surrounded" refers to that at least 50% (e.g., at least 60%, at least 70%, at least 80%, at least 90%, at least 95%, at least 99%, and 100%) of a perimeter of an area is surrounded. For example, at least 60% of the perimeter of the respective one of the plurality of light emitting regions LER is surrounded by one or more photosensors of the plurality of photosensors PS. Referring to FIG. 6A, at least 60% of the perimeter of the respective one of the plurality of light emitting regions LER is surrounded by two photosensors of the plurality of photosensors PS.

In some embodiments, referring to FIG. 6A, multiple photosensors of the plurality of photosensors PS in the substantially transparent non-light emitting region TR are electrically connected in parallel to a same one of the plurality of first thin film transistors TFT1. FIG. 6A shows that three photosensors of the plurality of photosensors PS corresponding to (e.g., substantially surrounding) four of the plurality of light emitting regions LER are electrically connected in parallel to a same one of the plurality of first thin film transistors TFT1. In one example, the first polarity semiconductor layers of three photosensors of the plurality of photosensors PS corresponding to four of the plurality of light emitting regions LER are electrically connected in parallel to the first source electrode of the same one of the plurality of first thin film transistors TFT1. By electrically connecting in parallel multiple photosensors of the plurality of photosensors PS, the photocurrents from the multiple photosensors of the plurality of photosensors PS can be collectively detected, enhancing the signal-to-noise ratio and sensitivity of the photodetection.

In some embodiments, and referring to FIG. 6A, the multiple photosensors of the plurality of photosensors PS in the substantially transparent non-light emitting region TR are electrically connected in parallel to a same bias electrode BE. For example, the second polarity semiconductor layers of three photosensors of the plurality of photosensors PS corresponding to four of the plurality of light emitting regions LER are electrically connected in parallel to the same bias electrode BE.

Figure 6B:
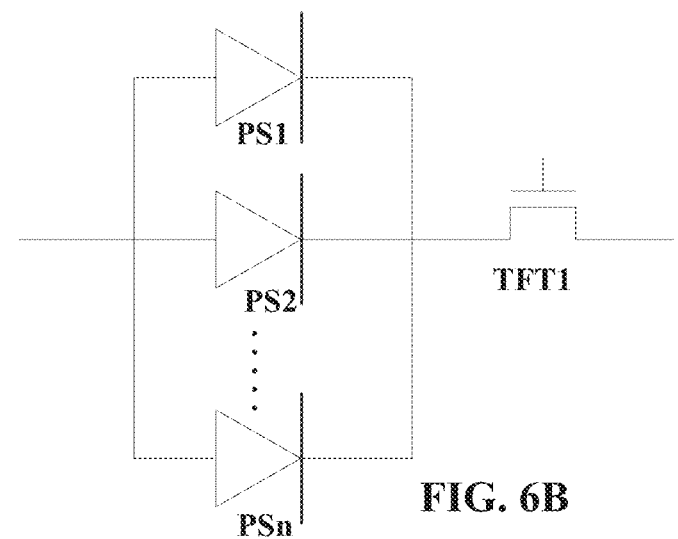
FIG. 6B is a circuit diagram illustrating multiple photosensors of a plurality of photosensors in a substantially transparent non-light emitting region electrically connected in parallel to a same one of the plurality of first thin film transistors.
Figure 7:
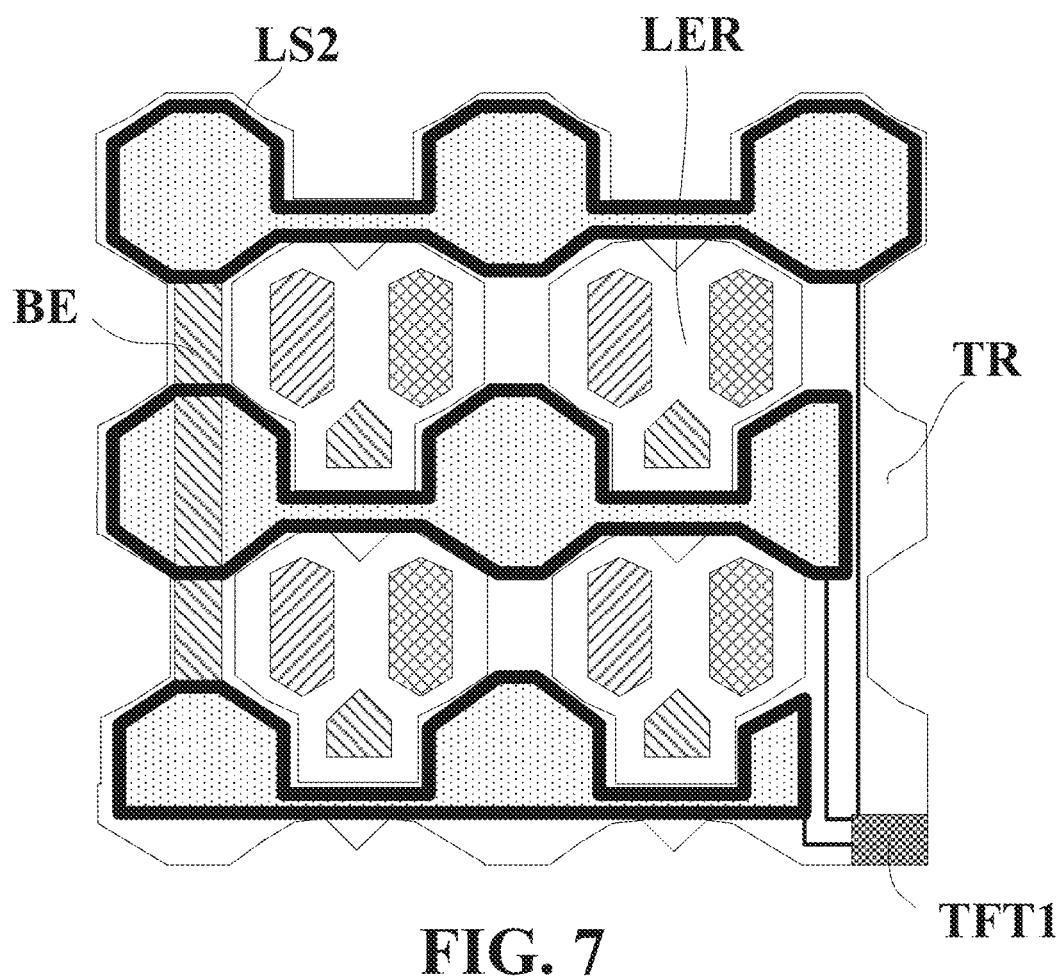
FIG. 7 illustrates the structure of a portion of an array substrate in a partially transparent area in some embodiments of the present disclosure.

FIG. 6B is a circuit diagram illustrating multiple photosensors of a plurality of photosensors in a substantially transparent non-light emitting region electrically connected in parallel to a same one of the plurality of first thin film transistors. Referring to FIG. 6B, n number of photosensors (PS1 to PSn) of a plurality of photosensors PS in a substantially transparent non-light emitting region TR are electrically connected in parallel to a same one of the plurality of first thin film transistors TFT1.

In some embodiments, the array substrate further includes a second light shielding layer LS2 substantially surrounding a respective one of the plurality of photosensors PS, and configured to shield the respective one of the plurality of photosensors PS from light emitted out of an adjacent subpixel in the plurality of light emitting regions LER. Optionally, the second light shielding layer LS2 is disposed in the substantially transparent non-light emitting region TR. Optionally, the second light shielding layer LS2 is on a lateral side of the respective one of the plurality of photosensors PS.

Optionally, the second light shielding layer LS2 is configured to substantially shield the lateral side of the respective one of the plurality of photosensors PS from light emitted out of the adjacent subpixel in the plurality of light emitting regions LER. Optionally, the second light shielding layer LS2 is configured to completely shield the lateral side of the respective one of the plurality of photosensors PS from light emitted out of the adjacent subpixel in the plurality of light emitting regions LER. Optionally, the second light shielding layer LS2 is configured to substantially shield all lateral sides of the respective one of the plurality of photosensors PS from light emitted out of the adjacent subpixel in the plurality of light emitting regions LER. Optionally, the second light shielding layer LS2 is configured to completely shield all lateral sides of the respective one of the plurality of photosensors PS from light emitted out of the adjacent subpixel in the plurality of light emitting regions LER.

Optionally, a side of the second light shielding layer LS2 closer to the base substrate 10 is in direct contact with the first polarity semiconductor layer PSL1 of the respective one of the plurality of photosensors PS. By having the second light shielding layer LS2, an accuracy of photodetection by the respective one of the plurality of photosensors PS can be significantly improved.

Optionally, the second light shielding layer LS2 has a height relative to a main surface of the buffer layer 20 equal to or greater than a height of the second polarity semiconductor layer PSL2 relative to the main surface of the buffer layer 20. Other appropriate designs may be implemented for disposing the second light shielding layer LS2. In another example, the second light shielding layer LS2 may be disposed on a surface of the buffer layer 20, and protruding along a direction away from the base substrate 10. In another example, the second light shielding layer LS2 may be disposed on a surface of the gate insulating layer 30, and protruding along a direction away from the base substrate 10. In another example, the second light shielding layer LS2 may be disposed on a surface of the base substrate 10, and protruding along a direction away from the base substrate 10.

Figure 8:
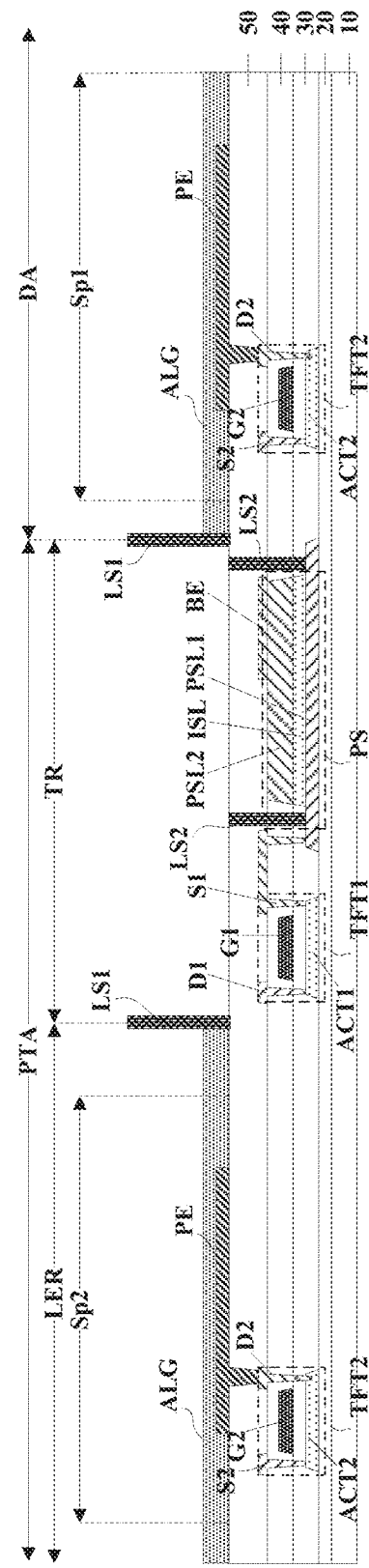
FIG. 8 is a cross-sectional view of an array substrate in some embodiments of the present disclosure.

Referring to FIG. 8, in some embodiments, the array substrate is an array substrate for a liquid crystal display panel. In some embodiments, the array substrate includes a pixel electrode PE on a side of the passivation layer 50 away from the base substrate 10, and electrically connected to the second drain electrode D2 of a respective one of the plurality of second thin film transistor TFT2. Optionally, the array substrate further includes an alignment layer ALG (e.g., a polyimide alignment layer) for aligning liquid crystal molecules to be disposed between the array substrate and a counter substrate in a display panel having the array substrate. The alignment layer ALG is on a side of the pixel electrode PE and the passivation layer 50 away from the base substrate 10. Optionally, to facilitate light detection by the plurality of photosensors PS, in some embodiments, the alignment layer ALG is substantially limited in the display area DA and in the plurality of light emitting regions LER of the partially transparent area PTA, and is absent in the substantially transparent non-light emitting region TR.

Referring to FIG. 2 and FIG. 4, in some embodiments, the first array of subpixels Sp1 has a number density of subpixels higher than a number density of subpixels of the second array of subpixels Sp2. In some embodiments, the first array of subpixels Sp1 includes first subpixels of a first color (e.g., red subpixels), first subpixels of a second color (e.g., green subpixels), and first subpixels of a third color (e.g., blue subpixels). Optionally, the second array of subpixels Sp2 includes second subpixels of the first color (e.g., red subpixels), second subpixels of the second color (e.g., green subpixels), and second subpixels of the third color (e.g., blue subpixels). Optionally, a number density of the first subpixels of the first color is substantially the same as a number density of the second subpixels of the first color. Optionally, a number density of the first subpixels of the second color is substantially the same as a number density of the second subpixels of the second color. Optionally, a number density of the first subpixels of the third color is approximately twice of a number density of the second subpixels of the third color.

Various appropriate photosensors may be utilized in making and using the present array substrate. Examples of photosensors include, but are not limited to, a PN photodiode, a PIN photodiode, an avalanche photodiode, a MIM diode junction, a MIS diode junction, a MOS diode junction, a SIS diode junction, and a MS diode junction.

Figure 9A:
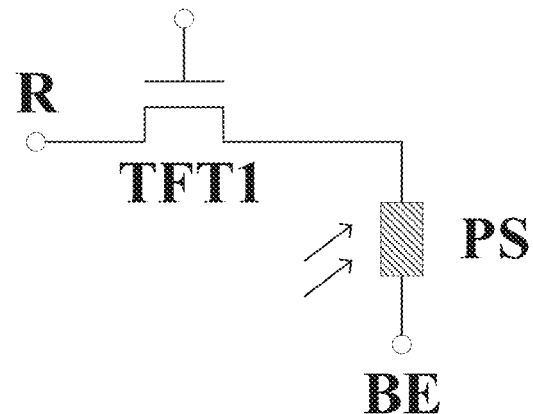
FIG. 9A is a circuit diagram of a respective one of the plurality of photosensors in some embodiments according to the present disclosure.

FIG. 9A is a circuit diagram of a respective one of the plurality of photosensors in some embodiments according to the present disclosure. Referring to FIGS. 3, 5-8, and 9A, the respective one of the plurality of photosensors PS in some embodiments is electrically connected to a respective one of the plurality of first thin film transistors TFT1. The first source electrode S1 of the respective one of the plurality of first thin film transistors TFT1 is electrically connected to the first polarity semiconductor layer PSL1 of the respective one of the plurality of photosensors PS. The first drain electrode D1 of the respective one of the plurality of first thin film transistors TFT1 is electrically connected to a read line R, which may in turn further connects to other components (e.g., a digital camera). The second polarity semiconductor layer PSL2 of the respective one of the plurality of photosensors PS is connected to the bias electrode BE, which is configured to provide a bias voltage to the respective one of the plurality of photosensors PS.

Figure 9B:
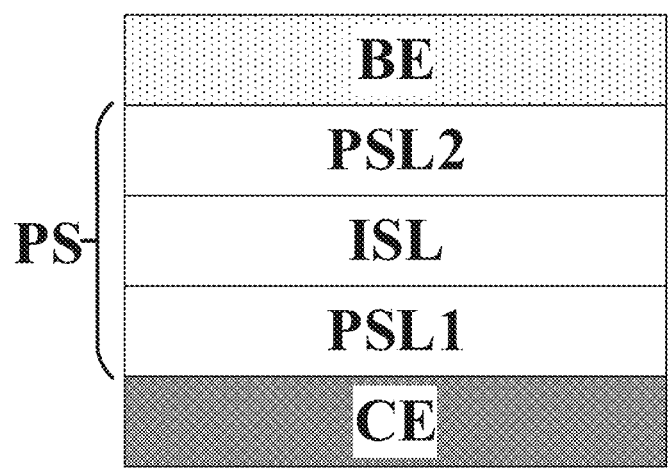
FIG. 9B is a schematic diagram illustrating the structure of a respective one of the plurality of photosensors in some embodiments according to the present disclosure.

FIG. 9B is a schematic diagram illustrating the structure of a respective one of the plurality of photosensors in some embodiments according to the present disclosure. Referring to FIG. 9B, in some embodiments, the respective one of the plurality of photosensors PS is a PIN photodiode. In some embodiments, the respective one of the plurality of photosensors PS includes a first polarity semiconductor layer PSL1 electrically connected to a connecting electrode CE, which in turn is electrically connected to the first source electrode S1 of the respective one of the plurality of first thin film transistors TFT1. The respective one of the plurality of photosensors PS further includes a second polarity semiconductor layer PSL2 electrically connected to the bias electrode BE; and an intrinsic semiconductor layer ISL connecting the first polarity semiconductor layer PSL1 and the second polarity semiconductor layer PSL2. As used herein, the term "intrinsic semiconductor layer" refers to a layer that can exhibit current rectification. e.g., a layer that exhibits drastically different conductivities in one bias direction relative to the other.

Optionally, the respective one of the plurality of photosensors PS includes a first polarity semiconductor layer PSL1 having a first dopant, a second polarity semiconductor layer PSL2 having a second dopant, and an intrinsic semiconductor layer ISL connecting the first polarity semiconductor layer PSL1 and the second polarity semiconductor layer PSL2. For example, the first dopant is N-type dopant such as a Group VA element of the Periodic Table of the Elements including nitrogen (N), phosphorous (P), arsenic (As), antimony (Sb), and bismuth (Bi); and the second dopant is P-type dopant such as a Group IIIA element of the Periodic Table of the Elements including boron (B), aluminum (Al), gallium (Ga), indium (In), and thallium (Tl). Optionally, the respective one of the plurality of photosensors PS is in a reversely biased. In some embodiments, the respective one of the plurality of photosensors PS is a PN junction having a P+ doping semiconductor region as the first polarity semiconductor layer PSL1 and an N+ doping semiconductor region as the second polarity semiconductor layer PSL2. In some embodiments, the respective one of the plurality of photosensors PS is a PIN photodiode having a P+ doping semiconductor region as the first polarity semiconductor layer PSL1, an N+ doping semiconductor region as the second polarity semiconductor layer PSL2, and an intrinsic semiconductor layer ISL of polysilicon between the P+ doping semiconductor region and the N+ doping semiconductor region.

Various appropriate materials may be used for making the first light shielding layer LS1 and the second light shielding layer LS2. Examples of materials suitable for making the first light shielding layer LS1 and the second light shielding layer LS2 includes, but are not limited to, black light absorbing materials such as a black resin material.

In another aspect, the present disclosure provides a method of fabricating an array substrate. In some embodiments, the method includes forming a first array of subpixels in a display area; and forming a second array of subpixels in a partially transparent area. In some embodiments, the partially transparent area includes a plurality of light emitting regions spaced apart from each other by a substantially transparent non-light emitting region. Optionally, the second array of subpixels is limited in the plurality of light emitting regions. In some embodiments, the method further includes forming a plurality of photosensors and forming a plurality of first thin film transistors in the substantially transparent non-light emitting region. Optionally, a respective one of the plurality of photosensors is formed to comprise a first polarity semiconductor layer, a second polarity semiconductor layer, and an intrinsic semiconductor layer connecting the first polarity semiconductor layer and the second polarity semiconductor layer. Optionally, a respective one of the plurality of first thin film transistors is formed to comprise a first gate electrode, a first active layer, and a first source electrode and a first drain electrode respectively connected to the first active layer. Optionally, the intrinsic semiconductor layer and the first active layer are formed in a same layer using a same polysilicon material and a same mask plate. Optionally, the first polarity semiconductor layer is electrically connected to the first source electrode. Optionally, the second polarity semiconductor layer is formed using a metal oxide conductive material doped with an N-type dopant.

In some embodiments, the method includes forming a buffer layer on a base substrate; forming a first amorphous silicon material layer on a side of the buffer layer away from the base substrate; doping the first amorphous silicon material layer with a P-type dopant; patterning the first amorphous silicon material layer to form the first polarity semiconductor layer; forming a second amorphous silicon material layer on a side of the buffer layer and the first polarity semiconductor layer away from the base substrate; crystallizing the second amorphous silicon material layer to form a polysilicon material layer; and patterning the polysilicon material layer to form the intrinsic semiconductor layer and the first active layer. Optionally, the intrinsic semiconductor layer is formed on a side of the first polarity semiconductor layer away from the base substrate, and is in direct contact with the first polarity semiconductor layer.

In some embodiments, subsequent to forming the intrinsic semiconductor layer and the first active layer, the method further includes forming a metal oxide conductive material layer on a side of the intrinsic semiconductor layer away from the base substrate; doping the metal oxide conductive material layer with the N-type dopant; and patterning the metal oxide conductive material layer to form the second polarity semiconductor layer.

In some embodiments, subsequent to forming the second polarity semiconductor layer, the method further includes forming a conductive material layer on a side of the second polarity semiconductor layer away from the base substrate; and patterning the conductive material layer to form a bias electrode, the first source electrode, and the first drain electrode. Optionally, the bias electrode is electrically connected to the second polarity semiconductor layer.

Figure 11A:
FIGS. 11A to 11I illustrate a method of fabricating an array substrate in some embodiments according to the present disclosure.

FIGS. 11A to 11I illustrate a method of fabricating an array substrate in some embodiments according to the present disclosure. Referring to FIG. 11A, a buffer layer 20 is formed on a base substrate 10. Various appropriate insulating materials and various appropriate fabricating methods may be used to make the buffer layer 20. For example, an insulating material may be deposited on the substrate by a plasma-enhanced chemical vapor deposition (PECVD) process. Examples of appropriate insulating materials for making the buffer layer include, but are not limited to, $Si_xO_y$, $Si_xN_y$, $Si_xO_yN_z$, or a combination thereof. Optionally, the buffer layer 20 is made to have a thickness in a range of 300 nm to 600 nm.

Figure 11B:
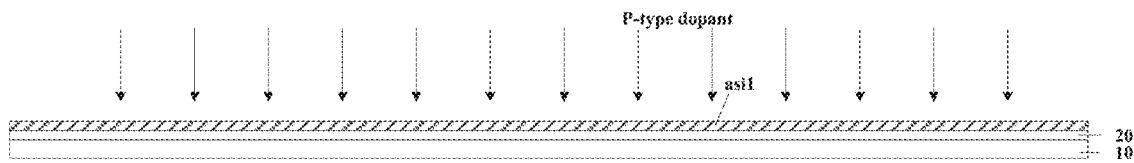

Referring to FIG. 11B, a first amorphous silicon material layer asi1 is formed on a side of the buffer layer 20 away from the base substrate 10. The first amorphous silicon material layer asi1 is doped with a P-type dopant. Optionally, the first amorphous silicon material layer asi1 is made to have a thickness in a range of 30 nm to 100 nm.

Figure 11C:

Referring to FIG. 11B and FIG. 11C, the first amorphous silicon material layer asi1 is patterned to form the first polarity semiconductor layer PSL1. The doping process may be performed prior to patterning the first amorphous silicon material layer asi1. Alternatively, the doping process may be performed subsequent to patterning the first amorphous silicon material layer asi1.

Figure 11D:
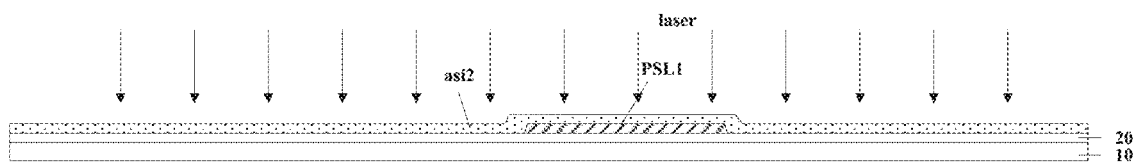

Referring to FIG. 11D, a second amorphous silicon material layer asi2 is formed on a side of the buffer layer 20 and the first polarity semiconductor layer PSL1 away from the base substrate 10. The second amorphous silicon material layer asi2 is crystallized. e.g., by a laser, to form a polysilicon material layer. Various appropriate crystallization methods may be used to crystallize the second amorphous silicon material layer asi2. Examples of appropriate crystallization methods include excimer laser annealing (ELA), solid phase crystallization (SPC), sequential lateral solidification (SLS), metal induced crystallization (MIC), and metal-induced lateral crystallization (MILC). Optionally, the second amorphous silicon material layer asi2 is formed to have a thickness in a range of 30 nm to 100 nm.

Figure 11E:
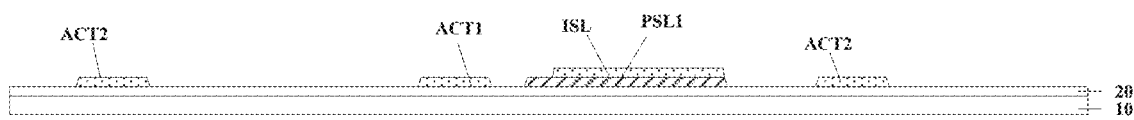

Referring to FIG. 11D and FIG. 11E, the polysilicon material layer is then patterned to form the intrinsic semiconductor layer ISL, the first active layer ACT1, and the second active layer ACT2. The crystallization process may be performed prior to patterning polysilicon material layer. Alternatively, the crystallization process may be performed subsequent to patterning polysilicon material layer. The intrinsic semiconductor layer ISL is formed on a side of the first polarity semiconductor layer PSL1 away from the base substrate 10, and is in direct contact with the first polarity semiconductor layer PSL1.

Figure 11F:
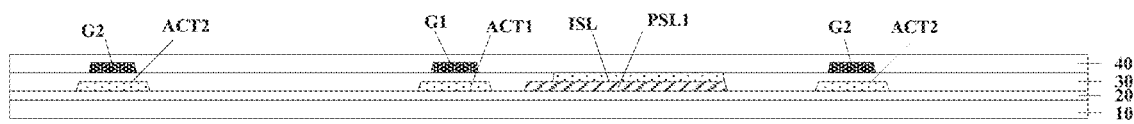

Referring to FIG. 11F, a gate insulating layer 30 is formed on a side of the first active layer ACT1 and the second active layer ACT2 away from the base substrate 10, a first gate electrode G1 is formed on a side of the gate insulating layer 30 away from the first active layer ACT1, a second gate electrode G2 is formed on a side of the gate insulating layer 30 away from the second active layer ACT2, and an inter-layer dielectric layer 40 is formed on a side of the first gate electrode G1 and the second gate electrode G2 away from the base substrate 10.

Various appropriate electrode materials and various appropriate fabricating methods may be used to make the gate electrode. For example, an electrode material may be deposited on the substrate by a plasma-enhanced chemical vapor deposition (PECVD) process and patterned. Examples of appropriate electrode materials for making the gate electrode include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first gate electrode G1 and the second gate electrode G2 are formed to have a thickness in a range of 100 nm to 300 nm.

Various appropriate insulating materials and various appropriate fabricating methods may be used to make the gate insulating layer 30 and the inter-layer dielectric layer 40. For example, an insulating material may be deposited on the substrate by a plasma-enhanced chemical vapor deposition (PECVD) process. Examples of appropriate insulating materials for making the gate insulating layer 30 and the inter-layer dielectric layer 40 include, but are not limited to, $Si_xO_y$, $Si_xN_y$, $Si_xO_yN_z$, or a combination thereof. Optionally, the gate insulating layer 30 is made to have a thickness in a range of 100 nm to 500 nm. Optionally, the inter-layer dielectric layer 40 is made to have a thickness in a range of 300 nm to 900 nm.

Figure 11G:
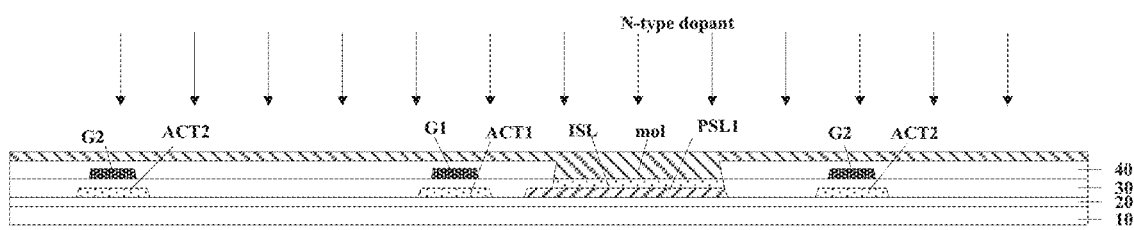

Referring to FIG. 11G, a via is formed to extend through the inter-layer dielectric layer 40 to expose a surface of the intrinsic semiconductor layer ISL, and a metal oxide conductive material layer mol is formed on a side of the intrinsic semiconductor layer ISL and the inter-layer dielectric layer 40 away from the base substrate 10. The metal oxide conductive material layer mol is doped with an N-type dopant. Various appropriate metal oxide conductive materials and various appropriate fabricating methods may be used to make the metal oxide conductive material layer mol. For example, a metal oxide conductive material may be deposited on the substrate by a plasma-enhanced chemical vapor deposition (PECVD) process. Examples of appropriate metal oxide conductive materials for making the metal oxide conductive material layer mol include, but are not limited to, indium tin oxide. Optionally, the metal oxide conductive material layer mol is made to have a thickness in a range of 30 nm to 100 nm.

Figure 11H:
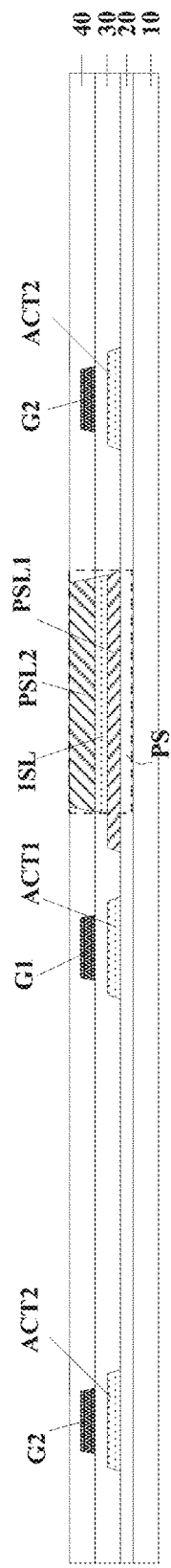

Referring to FIG. 11G and FIG. 11H, the metal oxide conductive material layer mol is then patterned to form the second polarity semiconductor layer PSL2.

Figure 11I:
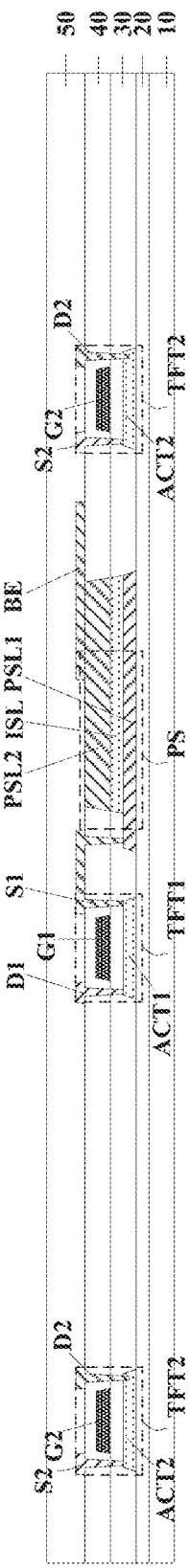

Referring to FIG. 11I, a first source electrode S1, a first drain electrode D1, a second source electrode S2, a second drain electrode D2, and a bias electrode BE are formed on a side of the inter-layer dielectric layer 40 away from the base substrate 10. Various appropriate conductive materials may be used for making the first source electrode S1, the first drain electrode D1, the second source electrode S2, the second drain electrode D2, and the bias electrode BE. For example, an electrode material may be deposited on the substrate, e.g., by sputtering or vapor deposition or solution coating; and patterned. Examples of appropriate electrode materials for making the first source electrode S1, the first drain electrode D1, the second source electrode S2, the second drain electrode D2, and the bias electrode BE include aluminum, molybdenum, aluminum Neodymium (AlNd), copper, molybdenum Niobium (MoNb), and alloys thereof. Optionally, the first source electrode S1, the first drain electrode D1, the second source electrode S2, the second drain electrode D2, and the bias electrode BE include a plurality of sub-layers laminated together. In one example, the first source electrode S1, the first drain electrode D1, the second source electrode S2, the second drain electrode D2, and the bias electrode BE include a titanium/aluminum/titanium three-layer structure. Optionally, each of the first source electrode S1, the first drain electrode D1, the second source electrode S2, the second drain electrode D2, and the bias electrode BE is made to have a thickness in a range of 300 nm to 900 nm.

A passivation layer 50 is then formed on a side of the first source electrode S1, the first drain electrode DL, the second source electrode S2, the second drain electrode D2, and the bias electrode BE away from the base substrate 10. Various appropriate insulating materials and various appropriate fabricating methods may be used to make the passivation layer 50. For example, an insulating material may be deposited on the substrate by a plasma-enhanced chemical vapor deposition (PECVD) process. Examples of appropriate insulating materials for making the passivation layer 50 include, but are not limited to, $Si_xO_y$, $Si_xN_y$, $Si_xO_yN_z$, or a combination thereof. Optionally, the passivation layer 50 is made to have a thickness in a range of 300 nm to 900 nm.

In another aspect, the present disclosure provides a display apparatus including the array substrate described herein or fabricated by a method described herein, and one or more integrated circuits connected to the array substrate. Optionally, the display apparatus includes a display panel. Optionally, the display panel includes the array substrate described herein or fabricated by a method described herein, and a counter substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

In some embodiments, the display apparatus is a self-emitting display apparatus such as an organic light emitting diode display apparatus. A respective subpixel of the first array of subpixels includes a self-emitting light emitting element, and a respective subpixel of the second array of subpixels includes a self-emitting light emitting element.

Figure 10:
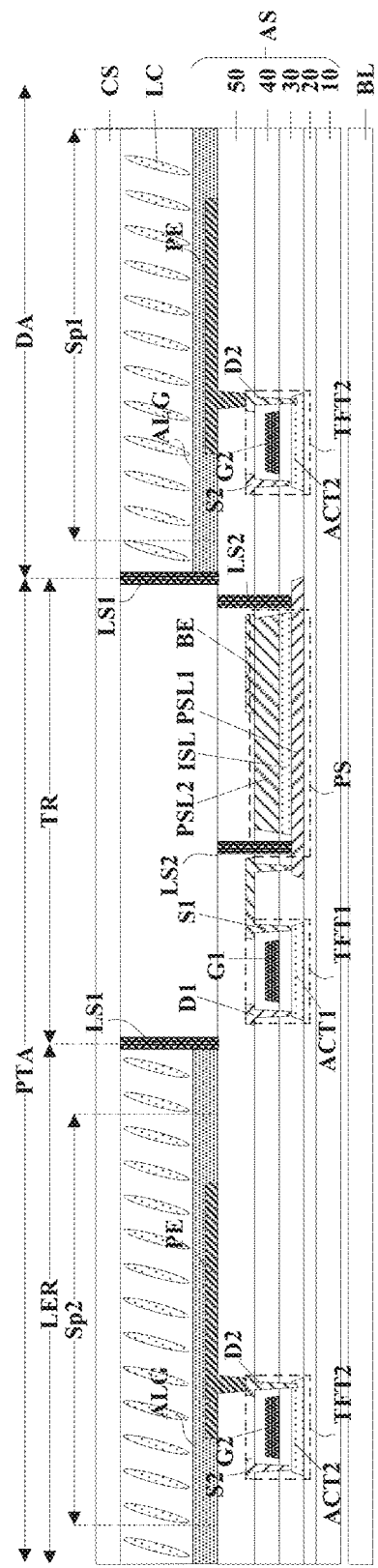
FIG. 10 is a cross-sectional view of a liquid crystal display apparatus in some embodiments of the present disclosure.

In some embodiments, the display apparatus is a liquid crystal display apparatus including the array substrate described herein or fabricated by a method described herein, a counter substrate facing the array substrate, a liquid crystal layer between the array substrate and the counter substrate, and a back light on a side of the array substrate away from the counter substrate. FIG. 10 is a cross-sectional view of a liquid crystal display apparatus in some embodiments of the present disclosure. Referring to FIG. 10, the display apparatus in some embodiments includes the array substrate AS described herein or fabricated by a method described herein, a counter substrate CS facing the array substrate AS, a liquid crystal layer LC between the array substrate AS and the counter substrate CS, and a back light BL on a side of the array substrate AS away from the counter substrate CS. As shown in FIG. 10, the liquid crystal layer LC is absent in the substantially transparent non-light emitting region TR.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a display area comprising a first array of subpixels; and
   a partially transparent area comprising a second array of subpixels;
   wherein the partially transparent area comprises a plurality of light emitting regions spaced apart from each other by a substantially transparent non-light emitting region;
   the second array of subpixels is limited in the plurality of light emitting regions; and
   the array substrate further comprises a plurality of photosensors and a plurality of first thin film transistors in the substantially transparent non-light emitting region;
   wherein a respective one of the plurality of photosensors comprises a first polarity semiconductor layer, a second polarity semiconductor layer, and an intrinsic semiconductor layer connecting the first polarity semiconductor layer and the second polarity semiconductor layer;
   a respective one of the plurality of first thin film transistors comprises a first gate electrode, a first active layer, and a first source electrode and a first drain electrode respectively connected to the first active layer; and
   the first array of subpixels has a number density of subpixels higher than a number density of subpixels of the second array of subpixels.

2. The array substrate of claim 1, wherein a respective one of the plurality of light emitting regions comprises multiple subpixels of the second array of subpixels;
   the respective one of the plurality of light emitting regions is substantially surrounded by one or more photosensors of the plurality of photosensors; and
   multiple photosensors of the plurality of photosensors in the substantially transparent non-light emitting region are electrically connected in parallel to a same one of the plurality of first thin film transistors.

3. The array substrate of claim 2, wherein, in the display area and the plurality of light emitting regions of the partially transparent area, the array substrate comprises a plurality of second thin film transistors for driving light emission in the display area and the plurality of light emitting regions;
   wherein the array substrate further comprises a passivation layer on a side of the plurality of photosensors, the plurality of first thin film transistors, and the plurality of second thin film transistors away from a base substrate; and
   one or more layers on a side of the passivation layer away from the base substrate, and limited in the display area and in the plurality of light emitting regions of the partially transparent area;
   wherein the one or more layers are absent in the substantially transparent non-light emitting region.

4. The array substrate of claim 1, wherein the second polarity semiconductor layer is electrically connected to a bias electrode; and
   the bias electrode, the first source electrode, and the first drain electrode are in a same layer and comprise a same material.

5. The array substrate of claim 1, wherein, in the display area and the plurality of light emitting regions of the partially transparent area, the array substrate comprises a plurality of second thin film transistors for driving light emission in the display area and the plurality of light emitting regions;
   a respective one of the plurality of second thin film transistors comprises a second gate electrode, a second active layer, and a second source electrode and a second drain electrode respectively connected to the second active layer;
   the second active layer, the intrinsic semiconductor layer, and the first active layer are in the same layer and comprise the same polysilicon material.

6. The array substrate of claim 5, wherein the second polarity semiconductor layer is electrically connected to a bias electrode; and
   the bias electrode, the first source electrode, the first drain electrode, the second source electrode, and the second drain electrode are in a same layer and comprise a same material.

7. The array substrate of claim 1, wherein multiple photosensors of the plurality of photosensors in the substantially transparent non-light emitting region are electrically connected in parallel to a same bias electrode.

8. The array substrate of claim 1, further comprising a light shielding layer substantially surrounding a respective one of the plurality of light emitting regions, and configured to shield at least a portion of light emitted out of the respective one of the plurality of light emitting regions from being received by an adjacent photosensor in the substantially transparent non-light emitting region.

9. The array substrate of claim 1, further comprising a light shielding layer substantially surrounding a respective one of the plurality of photosensors, and configured to shield the respective one of the plurality of photosensors from light emitted out of an adjacent subpixel in the plurality of light emitting regions.

10. The array substrate of claim 1, further comprising a buffer layer between the first active layer and a base substrate;
    wherein the first active layer and the first polarity semiconductor layer are in direct contact with the buffer layer.

11. The array substrate of claim 1, wherein the first polarity semiconductor layer comprises amorphous silicon doped with a P-type dopant; and
    the second polarity semiconductor layer comprises indium tin oxide.

12. The array substrate of claim 1, wherein the first array of subpixels comprises first subpixels of a first color, first subpixels of a second color, and first subpixels of a third color;
    the second array of subpixels comprises second subpixels of the first color, second subpixels of the second color, and second subpixels of the third color;
    a number density of the first subpixels of the first color is substantially the same as a number density of the second subpixels of the first color;
    a number density of the first subpixels of the second color is substantially the same as a number density of the second subpixels of the second color; and
    a number density of the first subpixels of the third color is approximately twice of a number density of the second subpixels of the third color.

13. A display apparatus, comprising the array substrate of claim 1, and one or more integrated circuits connected to the array substrate.

14. An array substrate, comprising:
a display area comprising a first array of subpixels; and
a partially transparent area comprising a second array of subpixels;
wherein the partially transparent area comprises a plurality of light emitting regions spaced apart from each other by a substantially transparent non-light emitting region;
the second array of subpixels is limited in the plurality of light emitting regions; and
the array substrate further comprises a plurality of photosensors and a plurality of first thin film transistors in the substantially transparent non-light emitting region;
wherein a respective one of the plurality of photosensors comprises a first polarity semiconductor layer, a second polarity semiconductor layer, and an intrinsic semiconductor layer connecting the first polarity semiconductor layer and the second polarity semiconductor layer; and
a respective one of the plurality of first thin film transistors comprises a first gate electrode, a first active layer, and a first source electrode and a first drain electrode respectively connected to the first active layer;
wherein the intrinsic semiconductor layer and the first active layer are in a same layer and comprise a same polysilicon material;
the first polarity semiconductor layer is electrically connected to the first source electrode; and
the second polarity semiconductor layer comprises a metal oxide conductive material doped with an N-type dopant.

15. A method of fabricating an array substrate, comprising:
forming a first array of subpixels in a display area; and
forming a second array of subpixels in a partially transparent area;
wherein the partially transparent area comprises a plurality of light emitting regions spaced apart from each other by a substantially transparent non-light emitting region;
the second array of subpixels is limited in the plurality of light emitting regions; and
the method further comprises forming a plurality of photosensors and forming a plurality of first thin film transistors in the substantially transparent non-light emitting region;
wherein a respective one of the plurality of photosensors is formed to comprise a first polarity semiconductor layer, a second polarity semiconductor layer, and an intrinsic semiconductor layer connecting the first polarity semiconductor layer and the second polarity semiconductor layer;
a respective one of the plurality of first thin film transistors is formed to comprise a first gate electrode, a first active layer, and a first source electrode and a first drain electrode respectively connected to the first active layer;
the first array of subpixels has a number density of subpixels higher than a number density of subpixels of the second array of subpixels.

16. The method of claim 15, wherein the intrinsic semiconductor layer and the first active layer are formed in a same layer using a same polysilicon material and a same mask plate;
the first polarity semiconductor layer is electrically connected to the first source electrode; and
the second polarity semiconductor layer is formed using a metal oxide conductive material doped with an N-type dopant.

17. The method of claim 15, comprising:
forming a buffer layer on a base substrate;
forming a first amorphous silicon material layer on a side of the buffer layer away from the base substrate;
doping the first amorphous silicon material layer with a P-type dopant;
patterning the first amorphous silicon material layer to form the first polarity semiconductor layer;
forming a second amorphous silicon material layer on a side of the buffer layer and the first polarity semiconductor layer away from the base substrate;
crystallizing the second amorphous silicon material layer to form a polysilicon material layer; and
patterning the polysilicon material layer to form the intrinsic semiconductor layer and the first active layer;
wherein the intrinsic semiconductor layer is formed on a side of the first polarity semiconductor layer away from the base substrate, and is in direct contact with the first polarity semiconductor layer.

18. The method of claim 17, subsequent to forming the intrinsic semiconductor layer and the first active layer, further comprising:
forming a metal oxide conductive material layer on a side of the intrinsic semiconductor layer away from the base substrate;
doping the metal oxide conductive material layer with the N-type dopant; and
patterning the metal oxide conductive material layer to form the second polarity semiconductor layer.

19. The method of claim 18, subsequent to forming the second polarity semiconductor layer, further comprising:
forming a conductive material layer on a side of the second polarity semiconductor layer away from the base substrate;
patterning the conductive material layer to form a bias electrode, the first source electrode, and the first drain electrode;
wherein the bias electrode is electrically connected to the second polarity semiconductor layer.

* * * * *